US012702026B2

(12) United States Patent
Lee et al.

(10) Patent No.: US 12,702,026 B2
(45) Date of Patent: Aug. 4, 2026

(54) SEMICONDUCTOR PACKAGE

(71) Applicant: LG INNOTEK CO., LTD., Seoul (KR)

(72) Inventors: Hyun Sun Lee, Seoul (KR); Dae Sung Moon, Seoul (KR); Dong Hun Joung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 382 days.

(21) Appl. No.: 18/277,654

(22) PCT Filed: Feb. 17, 2022

(86) PCT No.: PCT/KR2022/002356

§ 371 (c)(1),
(2) Date: Aug. 17, 2023

(87) PCT Pub. No.: WO2022/177322

PCT Pub. Date: Aug. 25, 2022

(65) Prior Publication Data

US 2024/0136267 A1 Apr. 25, 2024
US 2024/0234281 A9 Jul. 11, 2024

(30) Foreign Application Priority Data

Feb. 17, 2021 (KR) ........................ 10-2021-0021109

(51) Int. Cl.
*H05K 1/11* (2006.01)
*H10W 70/63* (2026.01)
*H10W 90/00* (2026.01)

(52) U.S. Cl.
CPC .......... *H10W 70/635* (2026.01); *H05K 1/113* (2013.01); *H05K 1/115* (2013.01); *H10W 90/734* (2026.01)

(58) Field of Classification Search
CPC ........ H05K 1/0206; H05K 1/11; H05K 1/111; H05K 1/113; H05K 1/115; H05K 1/116;
(Continued)

(56) References Cited

U.S. PATENT DOCUMENTS 6,465,742 B1 10/2002 Hiraoka et al.
8,823,161 B2 9/2014 Kim
(Continued)

FOREIGN PATENT DOCUMENTS

CN 102487058 A 6/2012
JP 2020-96014 A 6/2020
(Continued)

*Primary Examiner* — Roshn K Varghese
(74) *Attorney, Agent, or Firm* — Birch, Stewart, Kolasch & Birch, LLP

(57) ABSTRACT

A semiconductor package according to an embodiment includes a first insulating layer; and a first through electrode part passing through the first insulating layer and having a shape elongated in a first direction; wherein the first through electrode part includes a plurality of first through electrodes spaced apart from each other in a second direction perpendicular to the first direction and a thickness direction; wherein at least one of the plurality of first through electrodes includes a first sub through electrode and a second sub through electrode spaced apart from each other in the first direction; and wherein at least one of the first sub through electrode and the second sub through electrode has a width in the first direction greater than a width in the second direction.

11 Claims, 9 Drawing Sheets third direction
(thickness direction)

first direction
(longitudinal direction)

(58) Field of Classification Search
    CPC ... H05K 2201/09563; H05K 2201/096; H05K
                2201/10969; H01L 23/49827; H01L
            23/3677; H01L 23/28; H01L 23/49822;
            H01L 23/49838; H01L 24/32; H01L
            2224/32235; H01L 2224/2919; H01L
                                    2224/8385
    See application file for complete search history.

(56)                    References Cited

U.S. PATENT DOCUMENTS

| | | | |
|---|---|---|---|
| 2004/0112635 A1* | 6/2004 | Sasaki | H01G 4/228 |
| | | | 174/262 |
| 2011/0193197 A1 | 8/2011 | Farooq et al. | |
| 2012/0139118 A1 | 6/2012 | Kim | |
| 2014/0042032 A1 | 2/2014 | Shimoyama et al. | |
| 2014/0174793 A1* | 6/2014 | Oh | H05K 1/0206 |
| | | | 29/852 |
| 2017/0040253 A1 | 2/2017 | Kim et al. | |
| 2017/0162527 A1 | 6/2017 | Kim et al. | |
| 2020/0296839 A1* | 9/2020 | Kondo | H05K 3/245 |
| 2021/0127478 A1* | 4/2021 | Feng | H05K 1/185 |
| 2022/0095455 A1* | 3/2022 | Mason | H05K 3/422 |

FOREIGN PATENT DOCUMENTS

| | | |
|---|---|---|
| KR | 10-2012-0059798 A | 6/2012 |
| KR | 10-2014-0020760 A | 2/2014 |
| KR | 10-2015-0097056 A | 8/2015 |
| KR | 10-2017-0017122 A | 2/2017 |
| KR | 10-2017-0067393 A | 6/2017 |
| KR | 10-2020-0008650 A | 1/2020 |
| KR | 10-2020-0089989 A | 7/2020 |
| TW | 472162 B | 1/2002 |

* cited by examiner

【FIG. 1a】
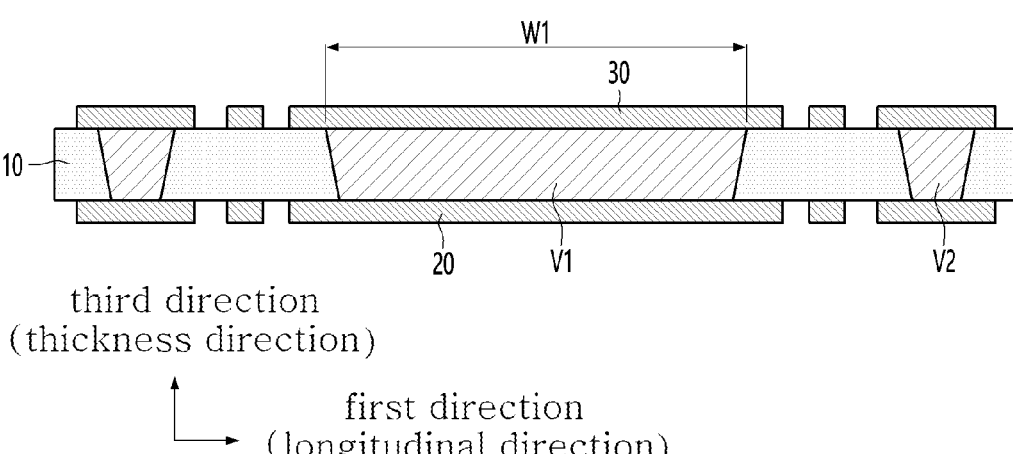
third direction
(thickness direction)
first direction
(longitudinal direction)

【FIG. 1b】
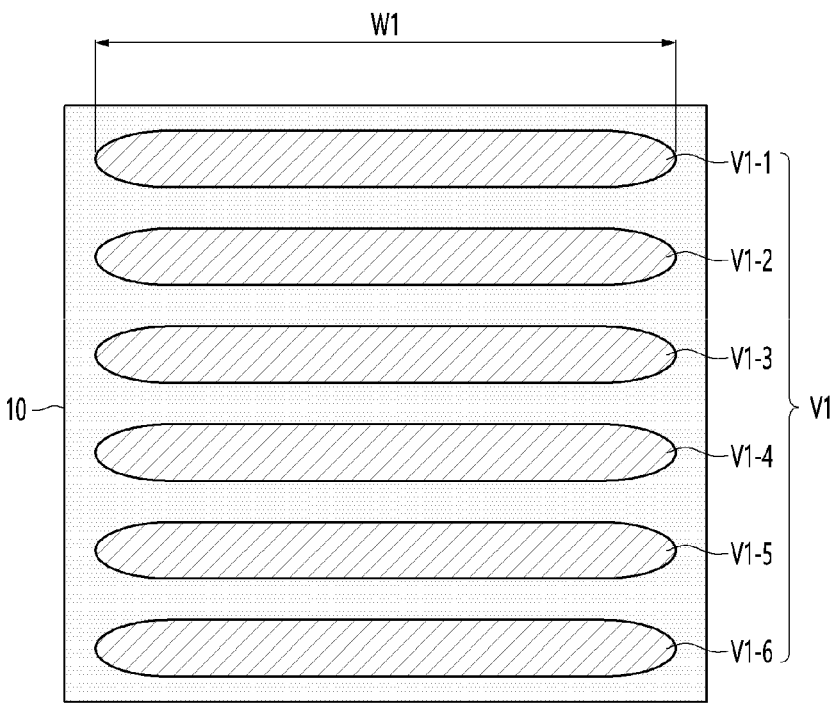
second direction
(width direction)
first direction
(longitudinal direction)

【FIG. 2】
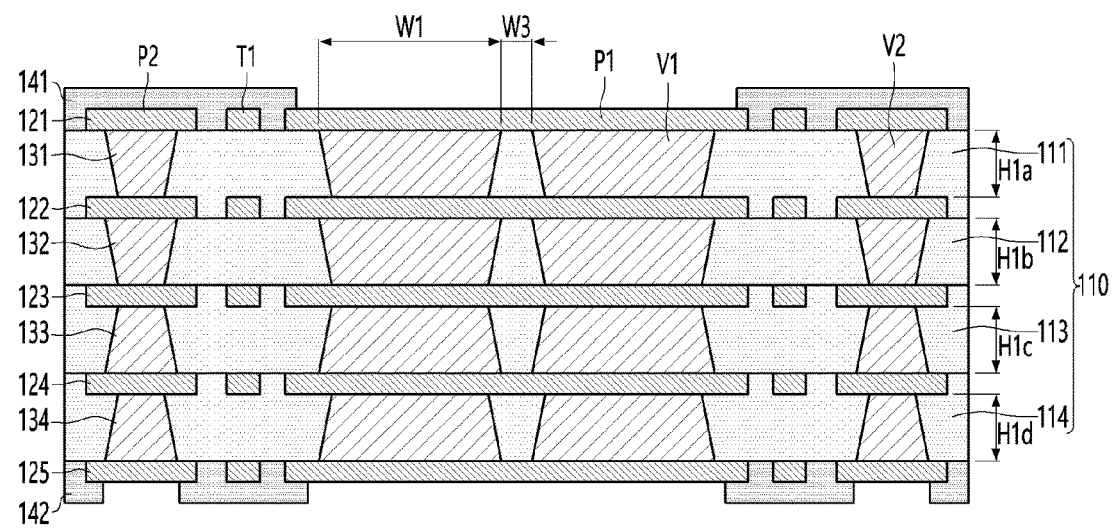
third direction
(thickness direction)
first direction
(longitudinal direction)

【FIG. 3】
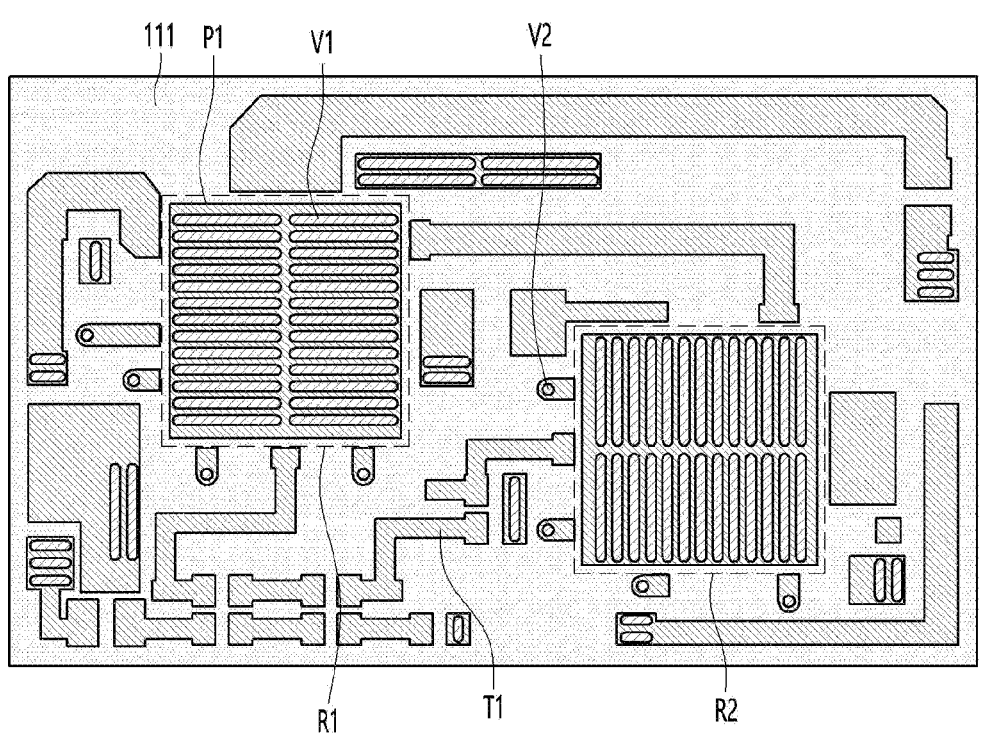

【FIG. 4】
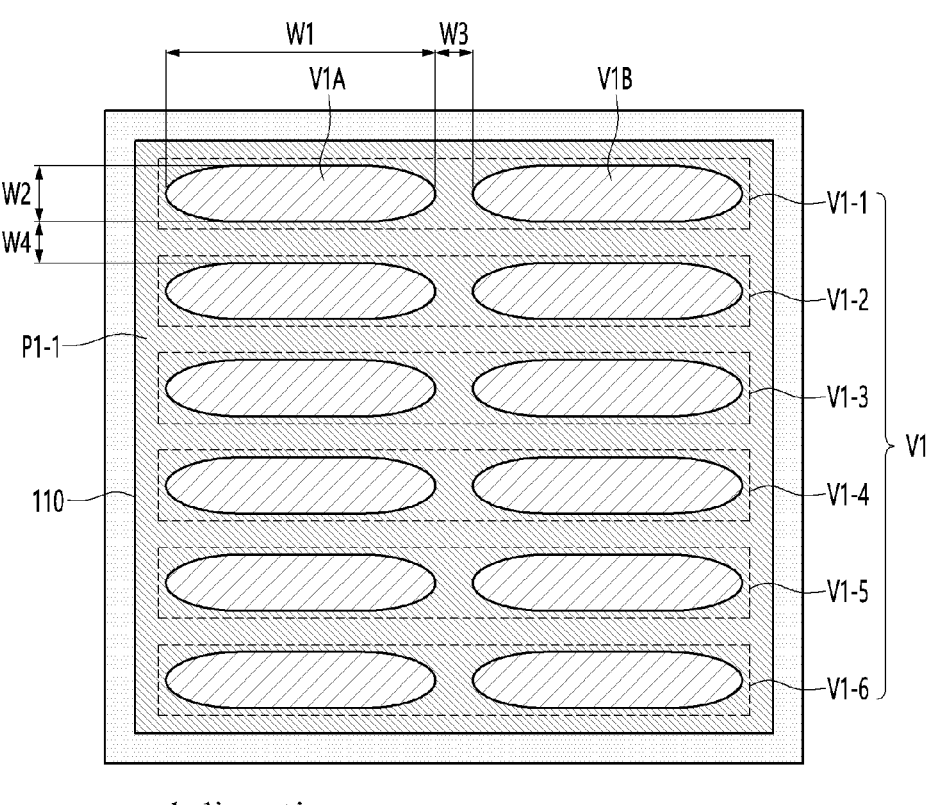
second direction
(width direction)
first direction
(longitudinal direction)

【FIG.  5】
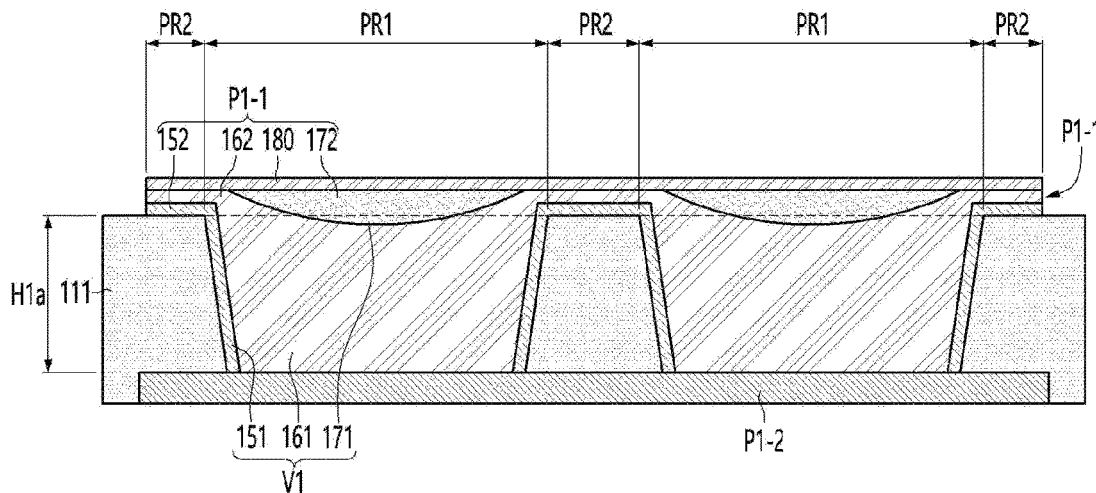
【FIG.  6】
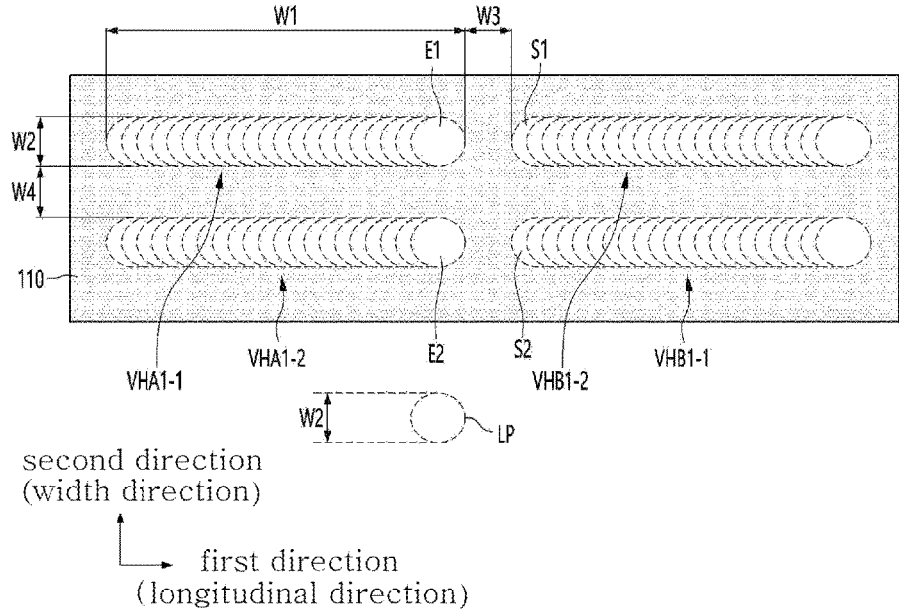
second direction
(width direction)
first direction
(longitudinal direction)

【FIG. 7】
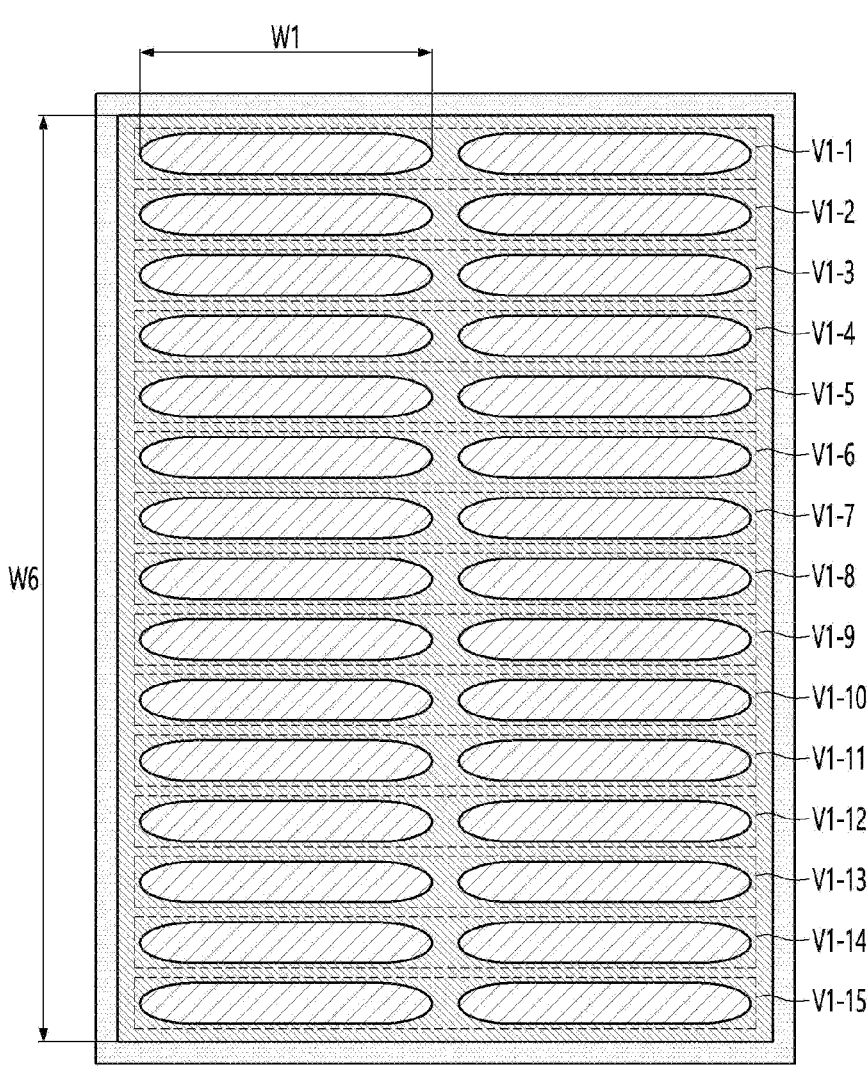

【FIG. 8】
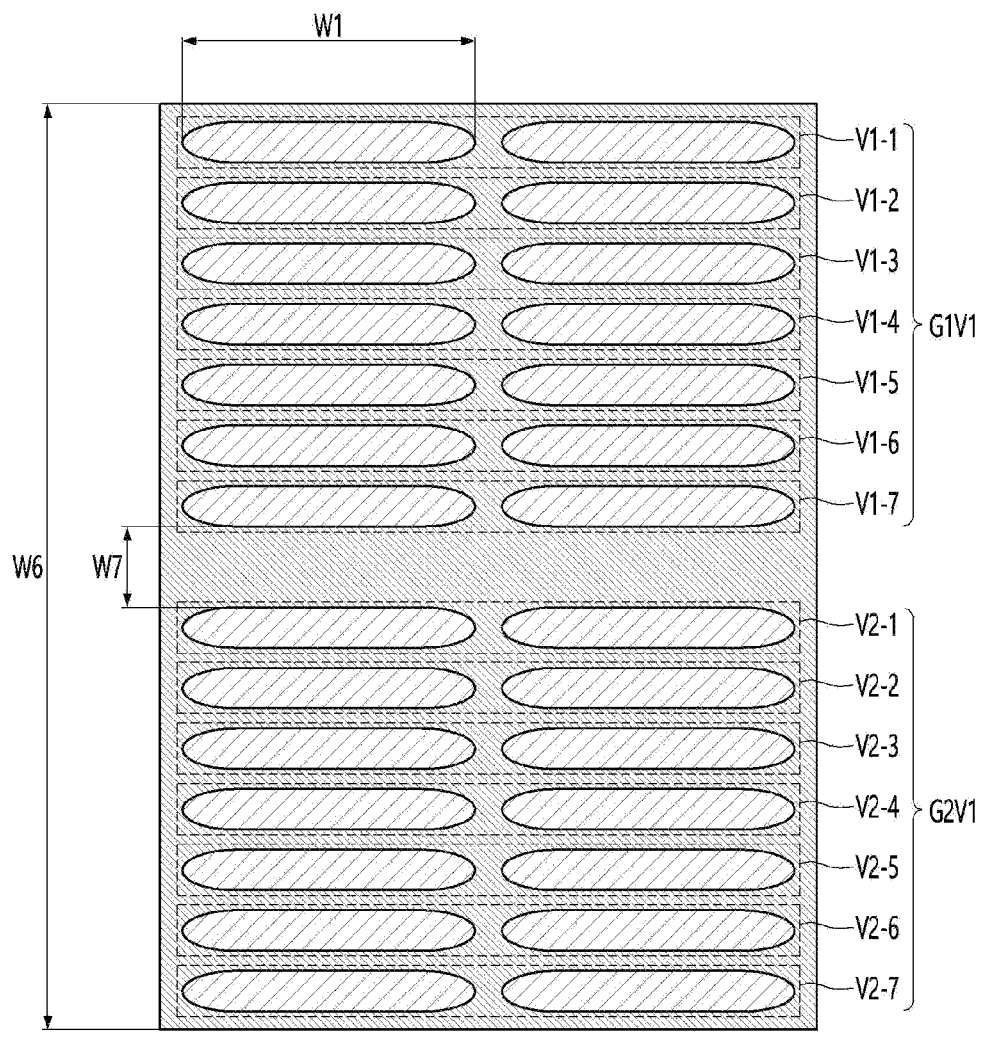

【FIG. 9】
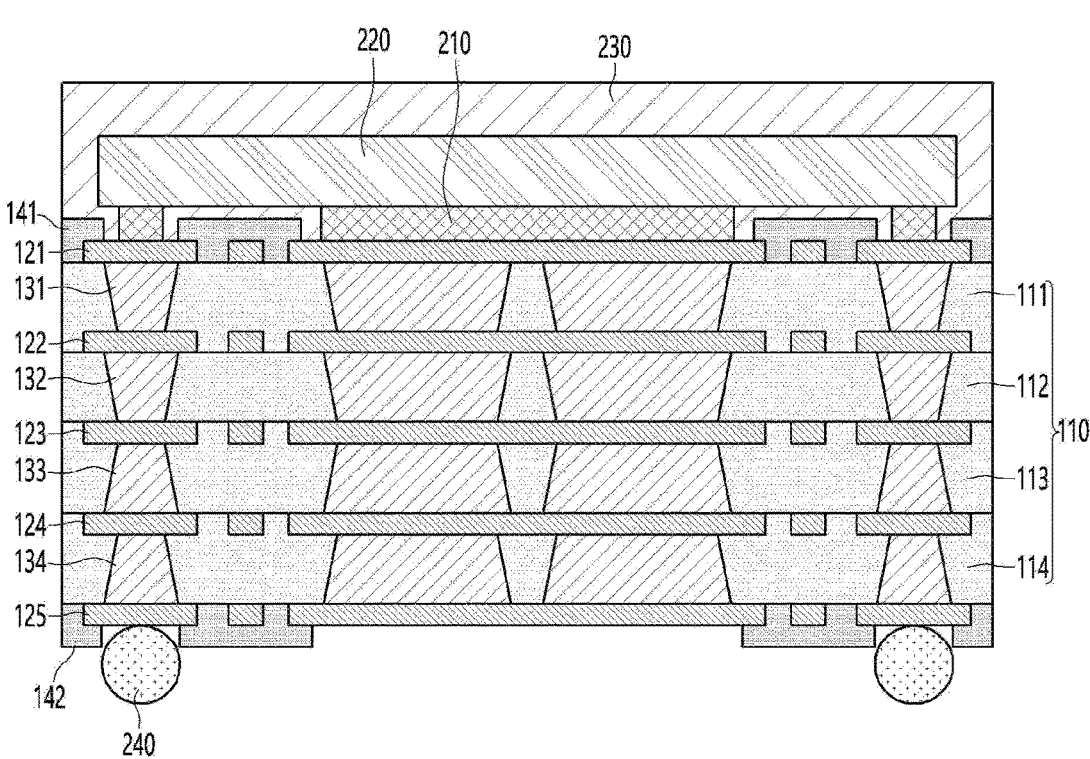

SEMICONDUCTOR PACKAGE

CROSS REFERENCE TO RELATED APPLICATIONS

This application is the National Phase of PCT International Application No. PCT/KR2022/002356, filed on Feb. 17, 2022, which claims priority under 35 U.S.C. 119 (a) to Patent Application No. 10-2021-0021109, filed in the Republic of Korea on Feb. 17, 2021, all of which are hereby expressly incorporated by reference into the present application.

BACKGROUND

Technical Field

An embodiment relates to a semiconductor package, and more particularly, to a semiconductor package including a through electrode having a large area.

Discussion of the Related Art

A line width of circuits is becoming smaller as the miniaturization, weight reduction, and integration of electronic components accelerate. In particular, as design rules of semiconductor chips are integrated on a nanometer scale, a circuit line width of a package substrate or a printed circuit board on which a semiconductor chip is mounted is reduced to several micrometers or less.

Various methods have been proposed in order to increase the degree of circuit integration of the printed circuit board, that is in order to miniaturize the line width of the circuits. A semi-additive process (SAP) method and a modified semi-additive process (MSAP) have been proposed in order to prevent loss of line width of the circuits in the etching step to form a pattern after copper plating.

Thereafter, an Embedded Trace Substrate (hereinafter referred to as 'ETS') method in which copper foil is buried in an insulating layer to implement a finer circuit pattern has been used in the art. The ETS method is manufactured by embedding the copper foil circuit in the insulating layer instead of forming it on the surface of the insulating layer. For this reason, there is no circuit loss due to etching, so it is advantageous to refine the circuit pitch.

Meanwhile, recently, efforts are being made to develop an improved 5th generation (5G) communication system or a pre-5G communication system in order to meet the demand for wireless data traffic. Here, the 5G communication system uses ultra-high frequency (mmWave) bands (sub 6 gigabytes (6 GHz), 28 gigabytes (28 GHz), 38 gigabytes (38 GHz) or higher frequencies) to achieve high data rates.

And, integration technologies such as beamforming, massive MIMO, and array antenna are being developed in order to alleviate the path loss of radio waves in the very high frequency band and increase the propagation distance of radio waves in the 5G communication system. Considering that these frequency bands can consist of hundreds of active antennas of wavelengths, the antenna system becomes relatively large.

Since these antennas and AP modules are patterned or mounted on a printed circuit board, low loss of the printed circuit board is very important. This means that several substrates constituting the active antenna system, ie, an antenna substrate, an antenna feeding substrate, a transceiver substrate, and a baseband substrate, must be integrated into one compact unit.

Meanwhile, recently, circuit boards including a large-area via have been developed in order to improve heat dissipation characteristics or shielding characteristics. The large-area via may be formed by filling a metal material in a large-diameter via hole. However, it is not easy to fill the inside of the large-diameter via hole with a metal material, and accordingly, a conventional large-area via includes a dimple region concavely recessed toward an inner direction of the via hole on one surface. In addition, the dimple region may affect via hole processing during additional lamination, and accordingly, the reliability of the printed circuit board is affected.

SUMMARY

An embodiment provides a circuit board and a semiconductor package including the same having a new structure.

An embodiment provides a circuit board and a semiconductor package including the same having a new structure capable of minimizing dimples of large-area vias, The technical problem to be solved in the embodiment is not limited to the technical problem mentioned above, and another technical problem not mentioned will be clearly understood by those of ordinary skill in the art to which the present invention belongs from the following description.

A semiconductor package according to an embodiment includes a first insulating layer; and a first through electrode part passing through the first insulating layer and having a shape elongated in a first direction; wherein the first through electrode part includes a plurality of first through electrodes spaced apart from each other in a second direction perpendicular to the first direction and a thickness direction; wherein at least one of the plurality of first through electrodes includes a first sub through electrode and a second sub through electrode spaced apart from each other in the first direction; and wherein at least one of the first sub through electrode and the second sub through electrode has a width in the first direction greater than a width in the second direction.

In addition, the semiconductor package further includes a fist-first pad disposed on an upper surface of the first insulating layer; and a first-second first pad disposed on a lower surface of the first insulating layer, wherein upper surfaces of the plurality of first through electrodes are in common contact with one first-first pad, and wherein lower surfaces of the plurality of first through electrodes are in common contact with one first-second pad.

In addition, a width of an upper surface of the first sub through electrode is greater than a width of a lower surface of the first sub through electrode; wherein the width of the first sub through electrode in the first direction is a width of the upper surface of the first sub through electrode in the first direction; and wherein the width of the first sub through electrode in the second direction is a width of the upper surface of the first sub through electrode in the second direction.

In addition, a width of an upper surface of the second sub through electrode is greater than a width of a lower surface of the second sub through electrode; wherein the width of the second sub through electrode in the first direction is a width of the upper surface of the second sub-through electrode in the first direction; and wherein the width of the second sub through electrode in the second direction is a width of the upper surface of the second sub through electrode in the second direction.

In addition, a width of at least one of the first and second sub-through electrodes in the first direction is 25 times or less the thickness of the first insulating layer.

In addition, a width of the first-first pad in the first direction is greater than 15 times the thickness of the first insulating layer.

In addition, the plurality of first through electrodes includes a first-first through electrode and a first-second through electrode spaced apart from each other in the second direction, wherein a first sub through electrode of the first-first through electrode is spaced apart from a second sub through electrode of the first-first through electrode by a first interval in the first direction; and wherein the first sub through electrode of the first-first through electrode is spaced apart from a first sub through electrode of the first-second through electrode by a second interval different from the first interval in the second direction.

In addition, the first interval is smaller than the second interval.

In addition, the semiconductor package further includes a second through electrode part including a second-first through electrode and a second-second through electrode passing through the first insulating layer, wherein the first-first through electrode and the first-second through-electrode constitute a first through electrode group, and wherein the second-first through electrode and the second-second through electrode constitute a second through electrode group spaced apart from the first through electrode group in the second direction.

In addition, the second through electrode group is spaced apart from the first through electrode group by a third interval in the second direction; and wherein the third interval is different from the first interval and the second interval.

In addition, the third interval is greater than the first interval and the second interval.

In addition, the first-first pad includes: a first pad region overlapping the first through electrode portion in the thickness direction; and a second pad region other than the first pad region; and wherein a layer structure of the first pad region is different from a layer structure of the second pad region.

In addition, the first pad region has a first number of layers, and wherein the second pad region has a second number of layers smaller than the first number of layers.

In addition, the semiconductor package further includes an adhesive member disposed on the first-first pad; and a chip attached to the adhesive member.

In addition, the chip includes a first AP chip and a second AP chip, wherein the first AP chip corresponds to a central processor (CPU), and wherein the second AP chip corresponds to a graphics processor (GPU).

Advantageous Effects

A circuit board of the embodiment includes a first via portion. The first via portion includes a plurality of first vias spaced apart from each other in a second direction. In this case, each of the plurality of first vias includes a plurality of sub vias spaced apart from each other in a first direction. In addition, each of the plurality of sub vias has a bar shape in which a width in a first direction is greater than a width in a second direction. In an embodiment, each of the first vias includes a plurality of sub vias extending in the first direction, and accordingly, the embodiment may reduce the number of plating processes compared to a comparative example. For example, the comparative example did not include a plurality of sub-vias as in the embodiment, but an integrated via made of one. However, when the width of the via is not considered at all as in the comparative example, a dimple size increases as the width of the via increases, and accordingly, there is a problem in that the number of plating processes increases.

In contrast, when the width of the via compared to the thickness of the insulating layer exceeds a certain level, the embodiment consists of a plurality of sub vias in order to minimize the dimples of the via, and accordingly, it is possible to reduce the number of plating processes by reducing the dimple size during the plating process.

In addition, the embodiment divides the plurality of first vias into a first via group and a second via group spaced apart in a second direction, a spaced interval between the first via group and the second via group is greater than a spaced interval between the plurality of first vias. Accordingly, the embodiment maintains the plating speed of the first vias included in the first via group and the plating speed of the first vias included in the second via group substantially the same. Accordingly, it is possible to maintain the flatness of the plating by minimizing the plating deviation. Also, the embodiment may improve the heat dissipation characteristics in an edge region by dividing the plurality of first vias into a first via group and a second via group as described above, and accordingly, reliability may be improved.

BRIEF DESCRIPTION OF THE DRAWINGS

FIG. 1a is a cross-sectional view showing a circuit board according to a comparative example.

FIG. 1b is a plan view showing a via included in the circuit board of FIG. 1a.

FIG. 2 is a cross-sectional view showing a circuit board according to an embodiment.

FIG. 3 is a plan view of a specific layer of the circuit board of FIG. 2.

FIG. 4 is a detailed plan view of the via region of FIG. 3.

FIG. 5 is a detailed view of the via region of FIG. 3.

FIG. 6 is a view for explaining a processing condition of a via hole in the embodiment.

FIG. 7 is a view showing a structure of a first via portion according to an embodiment, and FIG. 8 is a view showing a modified example of the first via portion of FIG. 7.

FIG. 9 is a view showing a package substrate according to an embodiment.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, an embodiment of the present invention will be described in detail with reference to the accompanying drawings.

Prior to the description of the present embodiment, a comparative example compared with the present embodiment will be described.

Meanwhile, a via described below may be referred to as a 'through electrode', and the via portion may also be referred to as a 'through electrode part'.

FIG. 1a is a cross-sectional view showing a circuit board according to a comparative example, and FIG. 1b is a plan view showing a via included in the circuit board of FIG. 1a.

Referring to FIGS. 1a and 1b, a circuit board of a comparative example includes a large-area via.

Specifically, the circuit board of the comparative example includes an insulating layer 10, a first pad 20, a third pad 30, a first via portion V1, and a second via portion V2.

The first pad 20 is disposed on a first surface of the insulating layer 10. The first surface is a lower surface of the insulating layer 10.

The second pad 30 is disposed on a second surface opposite to the first surface of the insulating layer 10. The second surface is an upper surface opposite to the lower surface of the insulating layer 10.

The circuit board includes vias disposed through the insulating layer 10. For example, the circuit board of the comparative example includes a first via portion V1 and a second via portion V2 passing through the insulating layer 10.

The first via portion V1 includes a large-area via. And, the second via portion V2 includes a normal via. For example, the first via portion V1 includes a large-area heat dissipation via formed for the purpose of dissipating heat or the like. Also, the second via portion V2 includes a via (e.g. a signal transmission via) having a width smaller than that of the first via portion V1.

In this case, the embodiment has a characteristic of a large-area via, and accordingly, the first via portion V1 of the comparative example compared thereto will be described.

The first via portion V1 includes a plurality of vias spaced apart from each other while being commonly connected to the first pad 20 and the second pad 30.

Each of the plurality of vias constituting the first via portion V1 is a large-area via. For example, the circuit board of the comparative example includes a large-area via. In addition, the large-area via has a larger area than a normal via. For example, the first via portion V1 includes a plurality of large-area vias having a width in a first direction (e.g. a longitudinal direction) greater than a width in a second direction (e.g. a width direction).

The first via portion V1 as described above is formed by filling the inside of a via hole with a metal material. In this case, it is difficult to completely fill the inside of the via hole in a large-area via as described above in one plating process. For example, when a large-area via is formed by filling the inside of the via hole with only one plating process, a dimple is generated in a region overlapping the first via portion V1 in a third direction (e.g. in a thickness direction) of an entire region of the second pad 30. The dimple means that a central portion of the first via portion V1 or the upper surface of the second pad 30 overlapping the first via portion V1 in the third direction is not flat but concave.

Accordingly, a plurality of plating processes are performed to form the first via portion V1 and the second pad 30 in the comparative example.

Specifically, the second pad 30 and the first via portion V1 are integrally formed with each other. For example, the second pad 30 and the first via portion V1 are formed by performing plating processes at least 5 times or more on the via hole and the second surface of the insulating layer 10.

That is, when the large-area first via portion V1 and the second pad 30 are formed, the large-area via hole constituting the first via portion V1 is not completely filled with only one or two plating processes, and accordingly, the dimple is generated in the first via portion V1 and the second pad 30. Accordingly, when the first via portion V1 and the second pad 30 in the comparative example are formed, the plating is performed at least 5 times to form the first via portion V1 and the second via portion V2.

In this case, a via hole for configuring the first via portion V1 in the comparative example is formed in consideration of only the size of a region (e.g. a heat dissipation region) in which the first via portion V1 is formed. That is, the size of the via hole constituting the first via portion V1 in the comparative example is determined by the width of the region.

Specifically, a plurality of first via portions V1 have a bar shape extending in the first direction (e.g. the longitudinal direction) and are spaced apart from each other in the second direction (e.g. the width direction).

That is, the first via portion V1 includes a first-first via V1-1, a first-second via V1-2, a first-third via V1-3, a first-fourth via V1-4, a first-fifth via V1-5, and a first-sixth via V1-6 spaced apart from each other in the second direction (e.g. in the width direction). The first-first via V1-1, the first-second via V1-2, the first-third via V1-3, the first-fourth via V1-4, the first-fifth via V1-5, and a first-sixth via V1-6 are disposed to be spaced apart from each other in the second direction (e.g. the width direction) in the insulating layer 10.

Here, a width w1 of each of the first-first via V1-1, the first-second via V1-2, the first-third via V1-3, the first-fourth via V1-4, the first-fifth via V1-5, and a first-sixth via V1-6 in the first direction (e.g. the longitudinal direction) is determined by a width of the region in the first direction.

That is, the first via portion V1 in the comparative example is formed in consideration of only the heat dissipation characteristic, and accordingly, the width w1 of each of the first-first via V1-1, the first-second via V1-2, the first-third via V1-3, the first-fourth via V1-4, the first-fifth via V1-5, and a first-sixth via V1-6 in the first direction (e.g. the longitudinal direction) is same as the width of the region in the first direction.

For example, when the width of the region in the first direction (e.g. the longitudinal direction) is 1000 μm, a first width w1 of each of the vias constituting the first via portion V1 in the first direction (e.g. a longitudinal direction) corresponds to 1000 μm. For example, when the width of the region in the first direction (e.g. the longitudinal direction) is 2000 μm, a first width w1 of each of the vias constituting the first via portion V1 in the first direction (e.g. a longitudinal direction) corresponds to 2000 μm. For example, when the width of the region in the first direction (e.g. the longitudinal direction) is 3000 μm, a first width w1 of each of the vias constituting the first via portion V1 in the first direction (e.g. a longitudinal direction) corresponds to 3000 μm. In this case, a normal circuit board has a width of 2430 μm or more in the first direction of the region, and each via constituting the first via portion V1 in the comparative example has a width of 2430 μm or more in the first direction (e.g. longitudinal direction).

As such, the first width w1 in the first direction (e.g. the longitudinal direction) of each via constituting the first via portion V1 is maximized in the comparative example, and accordingly, there is a problem that is very vulnerable to dimples.

For example, when the first width w1 in the first direction (for example, the longitudinal direction) exceeds a predetermined level or more compared to the height of each via constituting the first via portion V1, the size of the dimples generated in the process of plating the first via portion V1 is greatly increased.

Accordingly, the comparative example has a problem in that the number of plating processes for plating the first via portion V1 increases.

For example, generally, a plurality of vias constituting the first via portion V1 are simultaneously formed by a plating process. That is, even if the number of the plurality of vias constituting the first via portion V1 increases, the number of plating processes for forming the plurality of vias does not increase.

However, the width of the vias constituting the first via portion V1 in the comparative example is determined in the first direction (e.g. the longitudinal direction) in consideration of only the width of the region, and the number of plating processes for forming the plurality of vias is greatly increased. For example, as described above, the size of the dimple increases as the width of the vias constituting the first via portion V1 increases in the first direction (e.g. in the longitudinal direction). Accordingly, the number of plating proceeds increases in order to remove the dimples. Specifically, when the width of the vias constituting the first via portion V1 in the first direction (e.g. the longitudinal direction) exceeds 2000 μm, the plating process is performed at least 4 times or more in the comparative example to completely remove the dimples.

At this time, the normal circuit board has a multi-layer structure, and accordingly, the plating process as described above should be performed four or more times for each layer. For example, when the number of insulating layers is 10 and the number of plating processes to remove the dimples of the via for each layer is 4 times, the comparative example has a problem in that 40 plating processes must be performed to form a via portion on one circuit board.

Accordingly, the comparative example has a problem in that the product yield decreases as the number of plating processes for removing the dimples increases. In addition, when the number of plating processes for forming the first via portion V1 increases, the comparative example has a problem in that the number or thickness of the polishing process performed to planarize the upper surface of the second pad 30 increases.

Therefore, the embodiment including the large-area via limits the width of the large-area via in the first direction (e.g. the longitudinal direction) based on the height of the large-area via. The embodiment reduces the number of plating processes for forming the via portion, thereby improving the product yield.

FIG. 2 is a cross-sectional view showing a circuit board according to an embodiment, FIG. 3 is a plan view of a specific layer of the circuit board of FIG. 2, FIG. 4 is a detailed plan view of the via region of FIG. 3, FIG. 5 is a detailed view of the via region of FIG. 3, and FIG. 6 is a view for explaining a processing condition of a via hole in the embodiment.

Hereinafter, a circuit board according to an embodiment will be described in detail with reference to FIGS. 2 to 6.

The circuit board of the embodiment includes an insulating layer, a circuit pattern layer, a via portion, and a protective layer. The via portion includes a large-area via portion. For example, the via portion includes a large-area via portion in which a width in a first direction (e.g. a longitudinal direction) is greater than a width in a second direction (e.g. a width direction). For example, the large-area via portion may include a large-area via having a width in the first direction (e.g. the longitudinal direction) that is at least twice as large as the width in the second direction (e.g. the width direction). In this case, the embodiment allows the number of plating processes to be reduced to form a via portion composed of a large-area via and a pad connected thereto. Accordingly, hereinafter, the large-area vias included in the circuit board and the pads of the circuit pattern layer connected thereto will be mainly described. However, the embodiment is not limited thereto, and the circuit board may further include at least one of a trace, a normal size via, a chip mounting pad, a core pad, and a BGA pad, in addition to the large-area via portion and the pad connected thereto.

The insulating layer 110 may have a flat plate structure. At this time, although it is illustrated that the insulating layer 110 is composed of four layers in the drawing, the embodiment is not limited thereto. For example, the circuit board may include three or less insulating layers, and alternatively may include five or more insulating layers.

The insulating layer 110 is a substrate on which an electric circuit capable of changing wiring is formed, and may include all of a printed circuit board, a wiring board, and an insulating substrate made of an insulating material capable of forming circuit patterns on the surface.

For example, the insulating layer 110 may be rigid or flexible. For example, the insulating layer 110 may include glass or plastic. In detail, the insulating layer 110 may include chemically strengthened/semi-tempered glass such as soda lime glass or aluminosilicate glass, or reinforced or flexible plastics such as polyimide (PI), polyethylene terephthalate (PET), propylene glycol (PPG) polycarbonate (PC), or sapphire.

In addition, the insulating layer 110 may include a photoisotropic film. For example, the insulating layer 110 may include Cyclic Olefin Copolymer (COC), Cyclic Olefin Polymer (COP), photo-isotropic polycarbonate (PC), or photo-isotropic polymethylmethacrylate (PMMA).

In addition, the insulating layer 110 may be formed of a material including an inorganic filler and an insulating resin. For example, as a material constituting the insulating layer 110, a thermosetting resin such as an epoxy resin, and resins containing reinforcing materials such as inorganic fillers such as silica and alumina together with thermoplastic resins such as polyimide, specifically, Ajinomoto Build-up Film (ABF), FR-4, Bismaleimide Triazine (BT), Photo Imageable Dielectric resin (PID), BT, etc. may be used.

In addition, the insulating layer 110 may be bent while having a partially curved surface. That is, the insulating layer 110 may be bent while partially having a flat surface and partially having a curved surface. In detail, the insulating layer 110 may be bent while having a curved end or a surface including a random curvature, and may be bent or curved.

Such an insulating layer 110 may include a first insulating layer 111, a second insulating layer 112 disposed on a second surface of the first insulating layer 111, a third insulating layer 113 disposed on a second surface of the second insulating layer 112, a fourth insulating layer 114 disposed on a second surface of the third insulating layer 113. The first surface may be an upper surface, and the second surface may be a lower surface, but is not limited thereto.

A circuit pattern layer may be disposed on the surface of the insulating layer 110.

For example, the first circuit pattern layer 121 may be disposed on the first surface of the first insulating layer 111. For example, the second circuit pattern layer 122 may be disposed on the second surface of the first insulating layer 111 or the first surface of the second insulating layer 112. For example, the third circuit pattern layer 123 may be disposed on the second surface of the second insulating layer 112 or the first surface of the third insulating layer 113. For example, the fourth circuit pattern layer 124 may be disposed on the second surface of the third insulating layer 113 or the first surface of the fourth insulating layer 114. For example, a fifth circuit pattern layer 125 may be disposed on the second surface of the fourth insulating layer 114.

The circuit pattern layers as described above may be wirings that transmit electrical signals. Alternatively, the circuit pattern layers as described above may be heat transfer pads. To this end, the circuit pattern layers as described above may be formed of a metal material having high electrical conductivity or high thermal conductivity.

To this end, the circuit pattern layers may be formed of at least one metal material selected from among gold (Au), silver (Ag), platinum (Pt), titanium (Ti), tin (Sn), copper (Cu), and zinc (Zn). In addition, the circuit pattern layers may be formed of a paste or solder paste containing one metal material of gold (Au), silver (Ag), platinum (Pt), titanium (Ti), tin (Sn), copper (Cu), and zinc (Zn) having excellent bonding strength. Preferably, the circuit pattern layers may be formed of copper (Cu) having high electrical conductivity and a relatively inexpensive price.

The circuit pattern layers may be formed by an additive process, a subtractive process, a Modified Semi Additive Process (MSAP), and a semi-additive process (SAP), which is a typical printed circuit board manufacturing process, and detailed descriptions thereof will be omitted herein.

On the other hand, the circuit pattern layers include a pad (P). For example, the first circuit pattern layer 121 may include pads P1 and P2. For example, the second circuit pattern layer 122 may include pads P1 and P2. For example, the third circuit pattern layer 123 may include pads P1 and P2. For example, the fourth circuit pattern layer 124 may include pads P1 and P2. For example, the fifth circuit pattern layer 125 may include pads P1 and P2. The pads P1 and P2 may be via pads. For example, the pads P1 and P2 may be formed in a region overlapping with a first via portion V1 and a second via portion V2 to be described later in the third direction (e.g. the thickness direction). For example, the pads P1 and P2 may be directly connected to the first via portion V1 and the second via portion V2 to be described later.

Meanwhile, a via portion may be formed to pass through the insulating layer 110.

For example, a via portion may be formed to pass through the first insulating layer 111. For example, a via portion may be formed to pass through the second insulating layer 112. For example, a via portion may be formed to pass through the third insulating layer 113. For example, a via portion may be formed to pass through the fourth insulating layer 114.

The Via portions passing through each insulating layer may include a first via portion V1 and a second via portion V2. The first via portion V1 and the second via portion V2 may be classified according to their size. For example, a size of the first via portion V1 may be larger than a size of the second via portion V2. For example, a width of the first via portion V1 in the first direction may be greater than a width of the second via portion V2 in the second direction. For example, an area of the first via portion V1 may be larger than an area of the second via portion V2. For example, the area of the first via portion V1 may be at least twice the area of the second via portion V2. For example, the first via portion V1 may be a large-area via, and the second via portion V2 may be a normal via. For example, the first via portion V1 may be a heat dissipation via or a shielding via having a heat dissipation function or a shielding function, and the second via portion V2 may be a signal transmission via having a signal transmission function, but is not limited thereto.

That is, the first via portion V1 may be disposed in each insulating layer. For example, the first via portion V1 may be a part of the via portion 131 disposed in the first insulating layer 111. For example, the first via portion V1 may be a part of the via portion 132 disposed in the second insulating layer 112. For example, the first via portion V1 may be a part of the via portion 133 disposed in the third insulating layer 113. For example, the first via portion V1 may be a part of the via portion 134 disposed in the fourth insulating layer 114.

In this case, the circuit board of the embodiment is in the design or structure of the first via portion V1, and accordingly, the first via portion V1 will be described in more detail. Meanwhile, the first via portion V1 described below may be any one of via portions disposed in the plurality of insulating layers.

Accordingly, hereinafter, the first via portion V1 formed in any one of the first to fourth insulating layers will be described in detail.

Hereinafter, the first via portion V1 formed in the first insulating layer 111 will be mainly described. However, the first via portion V1 formed of the first insulating layer 111 described below may be formed in at least one of the second insulating layer 112, the third insulating layer 113, and the fourth insulating layer 114.

The first via portion V1 may be connected to the first pad P1 formed on the first and second surfaces of the first insulating layer 111. Also, the second via portion V2 may be connected to the second pad P2 formed on the first and second surfaces of the first insulating layer 111.

For example, a first-first pad P1-1 of the first pad P1 may be formed on the first surface of the first insulating layer 111. In addition, a first-second pad P1-2 of the first pad P1 may be formed on a second surface of the first insulating layer 111 opposite to the first surface.

The first via portion V1 is disposed to pass through the first insulating layer 111, and accordingly, the first via portion V1 may be connected to the first-first pad P1-1 and the first-second pad P1-2. For example, the first surface of the first via portion V1 may be directly connected to or in direct contact with the first-first pad P1-1. For example, the second surface of the first via portion V2 may be directly connected to or in direct contact with the first-second first pad P1-2.

Correspondingly, a second-first pad (not shown) of the second pad P2 may be formed on the first surface of the first insulating layer 111, and a second-second pad (not shown) of the second pad P2 may be formed on the second surface of the first insulating layer 111. Accordingly, the second via portion V2 may be directly connected to or in direct contact with the second-first pad and the second-second pad of the second pad P2.

The first via portion V1 may be formed in a specific region of the first insulating layer 111. For example, the first via portion V1 may be formed in a heat dissipation region of the first insulating layer 111. Here, the heat dissipation region may be a region for dissipating heat generated by the chip mounted on the circuit board of the embodiment to an outside. For example, a chip may be mounted on the outermost or inner side of the circuit board. In addition, the heat dissipation region may mean a region overlapping the mounted chip in a thickness direction. However, the embodiment is not limited thereto, and the first via portion V1 may be disposed in a region other than the heat dissipation region.

For example, the first insulating layer 111 may include a first region R1 and a second region R2 in which the first via portion V1 is disposed. In addition, the first via portion V1 may be formed in the first region R1 and the second region R2 of the first insulating layer 111, respectively. For example, as shown in FIG. 3, the first pad P1 is formed on the first insulating layer 111. The first pad P1 may mean the first-first pad P1-1 disposed on the first surface of the first insulating layer 111, or may mean the first-second pad P1-2 disposed on the second surface of the first insulating layer 111.

In addition, a trace Tl that is an elongated wire for transmitting a signal may be formed on the first surface or the second surface of the first insulating layer 111.

The first via portion V1 may include a plurality of vias spaced apart from each other. The first via portion V1 may be formed by forming a plurality of via holes passing through the first insulating layer 111, and simultaneously filling the inside of the formed via holes with a conductive material.

The via hole may be formed by any one of processing methods, including mechanical, laser, and chemical processing. When the via hole is formed by processing, methods such as milling, drilling, and routing can be used, and when the via hole is formed by laser processing, a UV or $CO_2$ laser method can be used, and when the via hole is formed by chemical processing, drugs including aminosilanes, ketones, etc. may be used, and accordingly, at least one insulating layer among the plurality of insulating layers may be opened.

On the other hand, the processing by the laser is a cutting method in which optical energy is concentrated on the surface to melt and evaporate a part of the material to take a desired shape, and it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the via hole is formed, the first via portion V1 may be formed by filling the inside of the via hole with a conductive material. Metal materials forming the first via portion V1 may be any one material selected from copper (Cu), silver (Ag), tin (Sn), gold (Au), nickel (Ni) and palladium (Pd), and the conductive material may be filled by any one of electroless plating, electrolytic plating, screen printing, sputtering, evaporation, ink-jetting, and dispensing.

Meanwhile, the first via portion V1 may include a plurality of vias having a bar shape extending in the first direction (length direction). In addition, the plurality of vias constituting the first via portion V1 may be spaced apart from each other in a second direction (width direction) perpendicular to the first direction (length direction).

For example, the first via portion V1 includes a plurality of first vias spaced apart from each other in the second direction (width direction). For example, the plurality of first vias constituting the first via portion V1 may include a first-first via V1-1, a first-second via V1-2, a first-third via V1-3, a first-fourth via V1-4, a first-fifth via V1-5, and a first-sixth via V1-6.

In this case, each of the first-first via V1-1, the first-second via V1-2, the first-third via V1-3, the first-fourth via V1-4, the first-fifth via V1-5, and the first-sixth via V1-6 may have a bar shape elongated in the first direction (length direction).

In this case, each of the first-first via V1-1, the first-second via V1-2, the first-third via V1-3, the first-fourth via V1-4, the first-fifth via V1-5, and the first-sixth via V1-6 may include a first sub-via V1A and a second sub-via V1B.

For example, the first-first via V1-1 may include a first sub-via V1A and a second sub-via V1B that are spaced apart from each other in the first direction (length direction). For example, the first-second via V1-2 may include a first sub-via V1A and a second sub-via V1B that are spaced apart from each other in the first direction (length direction). For example, the first-third via V1-3 may include a first sub-via V1A and a second sub-via V1B that are spaced apart from each other in the first direction (length direction). For example, the first-fourth via V1-4 may include a first sub-via V1A and a second sub-via V1B that are spaced apart from each other in the first direction (length direction). For example, the first-fifth via V1-5 may include a first sub-via V1A and a second sub-via V1B that are spaced apart from each other in the first direction (length direction). For example, the first-sixth via V1-6 may include a first sub-via V1A and a second sub-via V1B that are spaced apart from each other in the first direction (length direction).

Accordingly, the first sub-vias V1A of each of the vias constituting the first via portion V1 may be spaced apart from each other in the second direction (width direction). Also, correspondingly, the second sub-vias V1B of each of the vias constituting the first via portion V1 may be spaced apart from each other in the second direction (width direction).

In summary, the first via portion V1 of the embodiment includes a plurality of first vias spaced apart from each other in the second direction. In addition, each of the plurality of first vias includes a first sub-via V1A and a second sub-via V1B extending in the first direction. In addition, each of the first sub-via V1A and the second sub-via V1B is a large-area via having a bar shape having a width in the first direction greater than a width in the second direction.

In this case, a width of a first surface of each of the first sub-via V1A and the second sub-via V1B is different from a width of a second surface thereof. For example, via-holes constituting the first sub-via V1A and the second sub-via V1B may be formed by a laser process. In this case, the width at the portion directly touched by the laser is larger than the width at the opposite portion due to the characteristics of the laser process. For example, a laser may be provided on the first surface of the first insulating layer 111 to form a via hole passing through the first insulating layer 111. In this case, the first surface of the first insulating layer 111 is positioned close to the laser. Accordingly, a width on the first surface of the via hole formed in the first insulating layer 111 is greater than the width on the second surface thereof. For example, the via hole has an inverted trapezoidal shape in which the width of the first surface is greater than the width of the second surface due to characteristics of the laser process. Accordingly, a width (e.g. an upper width) of a first surface of the first sub-via V1A is greater than a width (e.g. a lower width) of the second surface of the first sub-via V1A. Also, the width of the first surface of the second sub via V1B is greater than the width of the second surface. Accordingly, the width of the via described below may refer to a width (e.g. an upper width of the first via portion disposed in the first insulating layer) on the first surface having a relatively wide width.

Meanwhile, each of the vias constituting the first via portion V1 in the embodiment is configured as a plurality of sub-vias spaced apart from each other in the first direction (length direction). For example, each of the plurality of first vias constituting the first via portion V1 in the embodiment includes a plurality of sub-vias spaced apart from each other in the first direction (length direction). For example, the comparative example did not include a plurality of sub-vias as in the embodiment, but an integrated via made of one. However, when the width of the via is not considered at all as in the comparative example, a dimple size increases as the width of the via increases, and accordingly, there is a problem in that the number of plating processes increases.

On the other hand, the embodiment forms a plurality of sub vias instead of one via in the first direction (length direction) in order to minimize the dimples of the via. Accordingly, the embodiment can reduce the dimple size during the plating process by having a plurality of sub-via structures rather than one integral structure as in the comparative example, and accordingly, the number of plating processes can be reduced.

For example, when a width in the first direction (longitudinal direction) of the region in which the first via portion V1 in the embodiment exceeds 25 times a thickness H1a of the first insulating layer 111, at least two sub-vias instead of one via may be disposed in the first direction (length direction).

For example, when a width in the first direction (longitudinal direction) of the region in which the first via portion V1 in the embodiment exceeds 21 times a thickness H1a of the first insulating layer 111, at least two sub-vias instead of one via may be disposed in the first direction (length direction). For example, when a width in the first direction (longitudinal direction) of the region in which the first via portion V1 in the embodiment exceeds 19 times a thickness H1a of the first insulating layer 111, at least two sub-vias instead of one via may be disposed in the first direction (length direction). For example, when a width in the first direction (longitudinal direction) of the region in which the first via portion V1 in the embodiment exceeds 17 times a thickness H1a of the first insulating layer 111, at least two sub-vias instead of one via may be disposed in the first direction (length direction). For example, when a width in the first direction (longitudinal direction) of the region in which the first via portion V1 in the embodiment exceeds 15 times a thickness H1a of the first insulating layer 111, at least two sub-vias instead of one via may be disposed in the first direction (length direction).

For example, the width W1 in the first direction (length direction) of the first sub-vias V1A constituting each of the first vias does not exceed 25 times the thickness H1a of the first insulating layer 111. For example, the width W1 in the first direction (length direction) of the first sub-vias V1A constituting each of the first vias does not exceed 121 of the thickness H1a of the first insulating layer 111. For example, the width W1 in the first direction (length direction) of the first sub-vias V1A constituting each of the first vias does not exceed 19 times the thickness H1a of the first insulating layer 111. For example, the width W1 in the first direction (length direction) of the first sub-vias V1A constituting each of the first vias does not exceed 17 times the thickness H1a of the first insulating layer 111. For example, the width W1 in the first direction (length direction) of the first sub-vias V1A constituting each of the first vias does not exceed 15 times the thickness H1a of the first insulating layer 111.

For example, the width W1 in the first direction (length direction) of the second sub-vias V1B constituting each of the first vias does not exceed 25 times the thickness H1a of the first insulating layer 111. For example, the width W1 in the first direction (length direction) of the second sub-vias V1B constituting each of the first vias does not exceed 21 times the thickness H1a of the first insulating layer 111. For example, the width W1 in the first direction (length direction) of the second sub-vias V1B constituting each of the first vias does not exceed 19 times the thickness H1a of the first insulating layer 111. For example, the width W1 in the first direction (length direction) of the second sub-vias V1B constituting each of the first vias does not exceed 17 times the thickness H1a of the first insulating layer 111. For example, the width W1 in the first direction (length direction) of the second sub-vias V1B constituting each of the first vias does not exceed 15 times the thickness H1a of the first insulating layer 111.

Meanwhile, as described above, the width of the first surface of each of the first sub-via V1A and the second sub-via V1B may be greater than the width of the second surface. That is, the upper width of the first sub-via V1A and the second sub-via V1B disposed in the first insulating layer 111 may be greater than the lower width thereof. In addition, the width W1 of each of the first sub-via V1A and the second sub-via V1B may mean a relatively large upper width.

For example, the thickness H1a of the first insulating layer 111 may be 40 μm to 70 μm. For example, the thickness H1a of the first insulating layer 111 may be 45 μm to 65 μm. For example, the thickness H1a of the first insulating layer 111 may be 50 μm to 60 μm.

In this case, the width in the first direction (length direction) of the first region R1 in which the first via portion V1 is disposed may be 2430 μm, which is 21 times greater than the thickness H1a of the first insulating layer 111. Here, the width in the first direction (length direction) of the first vias constituting the first via portion V1 in the comparative example has a width of 2430 μm corresponding to the width in the first direction (length direction) of the first region R1. In this case, as described above, when the width of the first vias in the first direction (length direction) exceeds 21 times the thickness H1a of the first insulating layer 111, the dimple size increases, and there is a problem in that the number of plating processes increases, thereby complicating the manufacturing process.

Meanwhile, the thickness H1a of the first insulating layer 111 may correspond to the distance or length in the third direction (thickness direction) between the circuit pattern layers disposed on the first and second surfaces thereof. For example, the thickness H1a of the first insulating layer 111 may correspond to a distance or length between the lower surface of the first circuit pattern layer 121 and the upper surface of the second circuit pattern layer 122.

A thickness of each of the second insulating layer 112, the third insulating layer 113, and the fourth insulating layer 114 may correspond to a thickness H1a of the first insulating layer 111.

A thickness H1b of the second insulating layer 112 may correspond to a thickness H1a of the first insulating layer 111. For example, the thickness H1b of the second insulating layer 112 may correspond to a distance or length between the lower surface of the second circuit pattern layer 122 and the third circuit pattern layer 123. For example, the thickness H1b of the second insulating layer 112 may be 40 μm to 70 μm. For example, the thickness H1b of the second insulating layer 112 may be 45 μm to 65 μm. For example, the thickness H1b of the second insulating layer 112 may be 50 μm to 60 μm.

A thickness H1c of the third insulating layer 113 may correspond to the thickness H1a of the first insulating layer 111. For example, the thickness H1c of the third insulating layer 113 may correspond to the distance or length between the lower surface of the third circuit pattern layer 123 and the upper surface of the fourth circuit pattern layer 124. For example, the thickness H1c of the third insulating layer 113 may be 40 μm to 70 μm. For example, the thickness H1c of the third insulating layer 113 may be 45 μm to 65 μm. For example, the thickness H1c of the third insulating layer 113 may be 50 μm to 60 μm.

A thickness H1d of the fourth insulating layer 114 may correspond to a thickness H1a of the first insulating layer 111. For example, the thickness H1d of the fourth insulating layer 114 may correspond to the distance or length between the lower surface of the fourth circuit pattern layer 124 and the upper surface of the fifth circuit pattern layer 125. For example, the thickness H1d of the fourth insulating layer 114 may be 40 μm to 70 μm. For example, the thickness H1d of the fourth insulating layer 114 may be 45 μm to 65 μm. For example, the thickness H1d of the fourth insulating layer 114 may be 50 μm to 60 μm.

Accordingly, the first vias constituting the first via portion V1 in the embodiment as described above are configured in at least two lines including a plurality of sub-vias instead of in one line, so that it is possible to simplify the manufacturing process by minimizing the dimple size generated in each via, and thereby reducing the number of plating processes.

For example, when the thickness H1a of the first insulating layer 111 is 55 μm, the width in the first direction (length direction) of the plurality of first vias constituting the first via portion V1 does not exceed 1385 μm.

Meanwhile, the width in the first direction (length direction) of the first region R1 may also be defined as a width W5 in the first direction (length direction) of the first pad P1 connected to the first via portion V1.

For example, when the width W5 in the first direction (length direction) of the first pad P1 connected to the first via portion V1 exceeds 15 times the thickness H1a of the first insulating layer 111, each of the first vias constituting the first via portion V1 includes a first sub-via V1A and a second sub-via V1B. For example, when the width W5 in the first direction (length direction) of the first pad P1 connected to the first via portion V1 exceeds 17 times the thickness H1a of the first insulating layer 111, each of the first vias constituting the first via portion V1 includes a first sub-via V1A and a second sub-via V1B. For example, when the width W5 in the first direction (length direction) of the first pad P1 connected to the first via portion V1 exceeds 19 times the thickness H1a of the first insulating layer 111, each of the first vias constituting the first via portion V1 includes a first sub-via V1A and a second sub-via V1B.

For example, when the width W5 in the first direction (length direction) of the first pad P1 connected to the first via portion V1 exceeds 21 times the thickness H1a of the first insulating layer 111, each of the first vias constituting the first via portion V1 includes a first sub-via V1A and a second sub-via V1B. For example, when the width W5 in the first direction (length direction) of the first pad P1 connected to the first via portion V1 exceeds 25 times the thickness H1a of the first insulating layer 111, each of the first vias constituting the first via portion V1 includes a first sub-via V1A and a second sub-via V1B. Accordingly, the embodiment may reduce the number of plating processes for forming the first via portion V1 compared to the comparative example.

For example, when one via hole having a width of 2000 μm in the first direction (longitudinal direction) is completely filled to form one via, the comparative example requires at least 5 plating processes. In contrast, two sub-vias in the embodiment are formed by completely filling two via holes having a width of 1000 μm in the first direction (length direction), and for this purpose, only two or three plating processes may be performed. Accordingly, in the above case, the embodiment can reduce the number of plating processes by at least one time compared to the comparative example in one layer. Furthermore, the embodiment may further reduce the number of plating processes compared to the comparative example as the number of layers of the circuit board increases.

Meanwhile, the width W2 in the second direction of the first sub-via V1A or the second sub-via V1B of each of the first vias constituting the first via portion V1 may be determined by a processing condition of a via hole corresponding to the first sub-via V1A or the second sub-via V1B. For example, when the via hole is formed by laser processing, the width W2 in the second direction may be determined by a size of a laser processing point. For example, the width W2 of the first sub-via V1A or the second sub-via V1B in the second direction may be 70 μm to 130 μm. For example, the width W2 of the first sub-via V1A or the second sub-via V1B in the second direction may be 80 μm to 120 μm. For example, the width W2 of the first sub-via V1A or the second sub-via V1B in the second direction may be 90 μm to 110 μm.

Meanwhile, the first sub-via V1A and the second sub-via V1B of each of the first vias constituting the first via portion V1 may be spaced apart by a first interval W3. In this case, the first interval W3 may be smaller than the width W2 of the first sub-via V1A or the second sub-via V1B in the second direction. For example, the first interval W3 may be 40 μm to 100 μm. For example, the first interval W3 may be 50 μm to 90 μm. For example, the first interval W3 may be 60 μm to 80 μm.

Meanwhile, each of the first vias constituting the first via portion V1 may be spaced apart from each other in the second direction as described above. In this case, each of the first vias constituting the first via portion V1 may be spaced apart from each other by a second interval W4 in the second direction. In this case, the second interval W4 may be a spaced interval between sub-vias adjacent to each other in the second direction. For example, the second interval W4 may mean a spaced interval between a first sub-via V1A of a first-first via V1-1 and a first sub-via V1A of a first-second via V1-2.

In this case, the second interval W4 may be larger than the first interval W3. For example, the second interval W4 may be 45 μm to 105 μm. For example, the second interval W4 may be 55 μm to 95 μm. For example, the second interval W4 may be 65 μm to 85 μm.

This may be in consideration of processing conditions of a via hole constituting the first via portion V1. That is, referring to FIG. 6, a plurality of via holes for forming the first via portion V1 in the embodiment are formed in the first insulating layer 111. In this case, the via hole may be as follows.

The via hole may include a first-first via hole VHA1-1 corresponding to the first sub-via V1A of the first-first via V1-1 of the first via portion V1. In addition, the via hole may include a first-second via hole VHB1-1 corresponding to the second sub-via V1B of the first-first via V1-1 of the first via portion V1. In addition, the via hole may include a second-first via hole VHA1-2 corresponding to the first sub-via V1A of the first-second via V1-2 of the first via portion V1. In addition, the via hole may include a second-second via hole VHB1-2 corresponding to the second sub-via V1B of the first-second via V1-1 of the first via portion V1.

At this time, the first-first via hole VHA1-1, the first-second via hole VHB1-1, the second-first via hole VHA1-2, and the 2-2 via hole VHB1-2 may be formed by a laser processing point LP having a diameter corresponding to the width W2 in the second direction of the first sub-via V1A or the second sub-via V1A, as described above. In this case, the laser processing point LP may be circular. Accordingly, the laser processing process should be performed while moving the laser processing point LP in the first direction in order to form a bar-shaped via hole elongated in the first direction. For example, the laser processing is performed at a plurality of processing points while moving the laser processing point LP in the first direction in order to form one via hole. For example, as shown in FIG. 6, a laser process should be performed at 23 laser processing points in order to form one via hole. At this time, the laser process has a processing error according to the process characteristics, and accordingly, the first interval W3 and the second interval W4 are adjusted so that adjacent vias are not connected to each other.

In this case, the first-first via hole VHA1-1 among the first-first via hole VHA1-1, the first-second via hole VHB1-1, the second-first via hole VHA1-2, and the second-second via hole VHB1-2 is spaced apart from the first-second via hole VHB1-1 in the first direction. In addition, the first-first via hole VHA1-1 is spaced apart from the second-first via hole VHA1-2 in the second direction. In addition, the second-first via hole VHA1-2 is spaced apart from the second-second via hole VHB1-2 in the first direction. In addition, the first-second via hole VHB1-1 is spaced apart from the second-second via hole VHB1-2 in the second direction. Here, the processing error to be considered is different according to a spaced direction. For example, the processing error may be considered only at one processing point in the case of via holes spaced apart from each other in the first direction. Alternatively, the processing error may be considered at all processing points (e.g. 23 processing points) in the case of via holes spaced apart from each other in the second direction.

For example, the laser processing of the first-first via hole VHA1-1 and the first-second via hole VHB1-1 may prevent them from being connected to each other by determining the first interval W3 by considering only the processing error of a first end point E1 which is a last processing point of the first-first via hole VHA1-1 and a first start point S1 which is a start processing point of the first-second via hole VHB1-1.

Similarly, the laser processing of the second-first via hole VHA1-2 and the second-second via hole VHB1-2 may prevent them from being connected to each other by determining the first interval W3 by considering only the processing error of a second end point E2 which is a last processing point of the second-first via hole VHA1-2 and a second start point S2 which is a start processing point of the second-second via hole VHB1-2.

In other words, the processing error may be considered only for one laser processing point in the case of the first interval W3, and thus may be set smaller than the second interval W4.

In contrast, the second interval W4 for preventing the first-first via hole VHA1-1 and the second-first via hole VHA1-2 from being connected to each other should be set by considering processing errors at all processing points (e.g. 23 processing points) of the first-first via hole VHA1-1 and processing error at all processing points (e.g. 23 processing points) of the second-first via hole VHA1-2.

For example, the second interval W4 for preventing the first-second via hole VHB1-1 and the second-second via hole VHB1-2 from being connected to each other should be set by considering processing errors at all processing points (e.g. 23 processing points) of the first-second via hole VHB1-1 and processing error at all processing points (e.g. 23 processing points) of the second-second via hole VHB1-2.

In other words, the second interval (W4) should be set in consideration of the processing error for all laser processing points, and accordingly, it may be set to be larger than the first interval W3.

Meanwhile, the pad P1 of the embodiment is connected to each of the first surface and the second surface of the first via portion V1. For example, the first-first pad P1-1 of the embodiment is directly connected to or in contact with the first surface of the first via portion V1. For example, the first-first pad P1-1 of the embodiment is commonly connected to the first surface of each of the first vias constituting the first via portion V1. For example, the first-first pad P1-1 of the embodiment is commonly connected to the first surface of each of the first sub-vias V1A and the second sub-vias V1B of the first vias. For example, the first-second pad P1-2 of the embodiment is directly connected to or in contact with the second surface of the first via portion V1. For example, the first-second pad P1-2 of the embodiment is commonly connected to the second surface of each of the first vias constituting the first via portion V1. For example, the first-second pad P1-2 of the embodiment is commonly connected to the second surface of each of the first sub-vias V1A and V1B of the first vias.

As described above, each of the plurality of first vias constituting the first via portion V1 of the embodiment does not consist of one via, but includes a plurality of sub-vias spaced apart from each other in the first direction. Accordingly, the embodiment may reduce the number of plating processes for forming the first via portion V1 compared to the comparative example.

Meanwhile, the first via portion V1 of the embodiment may be formed by a plurality of plating processes. In this case, the first via portion V1 and the first-first pad P1-1 may be integrally formed with each other. For example, the first via portion V1 and the first-first pad P1-1 may be simultaneously formed by a plating process. Accordingly, the first via portion V1 and the first-first pad P1-1 may be substantially referred to as one configuration. However, a part formed in the via hole of the first insulating layer 111 among the plating layer formed by the plating process in the embodiment is referred to as the first via portion V1, and a part formed on a first surface of the first insulating 111 and a first surface of the first via portion is referred to as the first-first pad P1-1.

The first-first pad P1-1 and the first via portion V1 may be formed by a plurality of plating processes. For example, the first-first pad P1-1 and the first via portion V1 may be formed by forming plating layers according to a two-time plating process. Accordingly, the first-first pad P1-1, the first-first pad P1-1, and the first via portion V1 may include a plurality of plating layers formed by a plurality of plating processes.

For example, the first-first pad P1-1 and the first via portion V1 may include a seed layer, a first plating layer, a second plating layer, and a third plating layer.

The seed layer may be a seed layer for forming the first plating layer, the second plating layer, and the third plating layer through electroplating. The seed layer may be formed on the first surface of the first insulating layer 111 and on an inner wall of a via hole formed in the first insulating layer 111.

The seed layer may include a first part 151 formed on an inner wall of the via hole and a second part 152 formed on a first surface of the first insulating layer 111. In addition, the first part 151 of the seed layer may constitute the first via portion V1. Also, the second part 152 of the seed layer may constitute the first-first pad P1-1.

The first plating layer may be formed by performing primary electrolytic plating using the seed layer. The first plating layer may include a first part 161 formed on the first part 151 of the seed layer and a second part 162 formed on the second part 152 of the seed layer. The first part 161 of the first plating layer may constitute the first via portion V1. In addition, the second part 162 of the first plating layer may constitute the first-first pad P1-1. The first part 161 of the first plating layer may partially fill an inside of the via hole. The second part 162 of the first plating layer may be formed to have a predetermined height on the second part 152 of the seed layer.

The first part 161 of the first plating layer may include a concave portion. For example, an upper surface of the first part 161 of the first plating layer may have a curved surface recessed in a downward direction. In this case, the lowermost end of the upper surface of the first part 161 of the first plating layer may be lower than the first surface of the first insulating layer 111. For example, the via holes formed in the first insulating layer 111 may not be completely filled by the first plating layer. For example, at least a part (e.g. the concave portion) of the via hole may not be filled by the first part 161 of the first plating layer.

The second plating layer may be formed on the first plating layer by performing secondary electrolytic plating using the seed layer.

The second plating layer includes a first part 171 formed on the first part 161 of the first plating layer, and a second part 172 formed on the second part 162 of the first plating layer. The first part 171 of the second plating layer may fill a concave portion of the first part 161 of the first plating layer. The first part 171 of the second plating layer may constitute the first via portion V1. In addition, the second part 172 of the second plating layer may constitute the first-first pad P1-1.

The third plating layer 180 may be formed on the second part 162 of the first plating layer and the second part 172 of the second plating layer. The third plating layer 180 may constitute the first-first pad P1-1. The third plating layer 180 may be formed on the second part 162 of the first plating layer and the second part 172 of the second plating layer by performing flash plating. The third plating layer 180 may be selectively formed to planarize the first surface of the first-first pad P1-1. For example, the third plating layer 180 may not be selectively formed. However, the third plating layer 180 is preferably formed for reliability of the first-first pad P1-1. For example, when the third plating layer 180 is not formed, the first surface of the first-first pad P1-1 is divided into a part corresponding to the second part 162 of the first plating layer and a part corresponding to the second part 172 of the second plating layer. And, the divided part thereof may be seen as a stain. Accordingly, the third plating layer in the embodiment is formed on the second part 162 of the first plating layer and the second part 172 of the second plating layer in order to solve the stain problem as described above while the first surface of the first-first pad P1-1 is flat.

Accordingly, the first-first pad P1-1 may be divided into a plurality of regions.

For example, the first-first pad P1-1 may include a first pad region PR1 overlapping the first via portion V1 in a third direction (thickness direction) and a second pad region PR2 other than the pad region PR1.

In this case, the first pad region PR1 and the second pad region PR2 may have different layer structures. For example, layers constituting the first pad region PR1 may be different from layers constituting the second pad region PR2. For example, a number of plating layers constituting the first pad region PR1 may be different from a number of plating layers constituting the second pad region PR2.

For example, the first pad region PR1 may include the first part 151 of the seed layer, the first part 161 of the first plating layer, the second part 172 of the second plating layer, the third plating layer 180. Alternatively, the second pad region PR2 may include the second part 152 of the seed layer, the second part 162 of the first plating layer, and the third plating layer 180. For example, the number of layers constituting the first pad region PR1 may be greater than the number of layers constituting the second pad region PR2.

As described above, the first vias constituting the first via portion V1 in the embodiment are not in one row, but are configured in at least two rows including a plurality of sub vias while being spaced apart from each other in the first direction, and accordingly, the embodiment minimizes the dimple size generated in each via and reduces the number of plating processes to simplify the manufacturing process.

Meanwhile, the circuit board includes a protective layer. The protective layer may be disposed on an outermost insulating layer of the circuit board. For example, the protective layer includes a first protective layer 141 disposed on a first surface of the first insulating layer 111 which is a first outermost insulating layer, and a second protective layer 142 disposed on the second surface of the fourth insulating layer 114 which is a second outermost insulating layer.

The first protective layer 141 includes an opening (not shown) exposing at least a portion of the first surface of the first circuit pattern layer 121 disposed on the first surface of the first insulating layer 111. The first protective layer 141 may be a solder resist, but is not limited thereto.

The second protective layer 142 includes an opening (not shown) exposing at least a portion of the second surface of the fifth circuit pattern layer 125 disposed on the second surface of the fourth insulating layer 114. The second protective layer 142 may be a solder resist, but is not limited thereto.

FIG. 7 is a view showing a structure of a first via portion according to an embodiment, and FIG. 8 is a view showing a modified example of the first via portion of FIG. 7.

Referring to FIG. 7, as described above, the first via portion V1 in the embodiment may include a plurality of first vias spaced apart from each other in the second direction. In addition, the plurality of first vias may include a plurality of sub-vias spaced apart from each other in the first direction.

For example, the first via portion V1 may include a first-first via V1-1, a first-second via V1-2, a first-third via V1-3, a first-fourth via V1-4, a first-fifth via 1-5 V1-5, a first-sixth via V1-6, a first-seventh via V1-7, a first-eighth via 1-8, a first-ninth via V1-9, a first-tenth via V1-10, a first-eleventh via V1-11, a first-twelfth via V1-12, a first-thirteenth via V1-13, a first-fourteenth V1-14, and a first-fifteenth via V1-15 including a plurality of sub-vias. That is, the number of first vias including the first sub-via V1A and the second sub-via V1B in the embodiment may be determined by the width W6 in the second direction of the first region R1 in which the first via portion V1 is disposed, In this case, as shown in FIG. 8, the second interval W4 corresponding to the spaced width in the second direction of each of the first vias constituting the first via portion V1 may be the same as each other.

However, generally, the heat generated by the chip is concentrated to an edge region, which is a border region, with respect to the first surface of the first-first pad P1-1. In this case, when the second interval W4 in the second direction is the same in the entire region as described above, the heat dissipation characteristic in the edge region may decrease.

Further, when plating a large-area bar via, the plating speed for each area is different depending on the plating characteristics. For example, in the case of the structure of FIG. 7, the plating speed of the first-first via V1-1, the first-second via V1-2, the first-third via V1-3, the first-fourth via V1-4, the first-fifth via 1-5 V1-5, the first-sixth via V1-6, the first-tenth via V1-10, the first-eleventh via V1-11, the first-twelfth via V1-12, the first-thirteenth via V1-13, the first-fourteenth V1-14, and the first-fifteenth via V1-15 relatively disposed in the edge region may be higher than the plating speed of the first-seventh via V1-7, the first-eighth via 1-8, and the first-ninth via V1-9 relatively disposed in the center. For example, when a large-area via is plated using a plating solution, copper particles are concentrated in the edge region compared to the central region, and accordingly, the plating speed in the edge region is increased. Accordingly, the thickness in the edge region of the first-first pad P1-1 may appear thicker than the thickness in the central region, and accordingly, a process time for planarizing the same may increase.

Accordingly, an interval between the first vias relatively disposed in the edge region of the first via portion V1 is smaller than an interval between the first vias disposed in the center.

For example, a plurality of first vias including a first sub via V1A and a second sub via V1B in the first via portion V1 of the embodiment may be divided into a plurality of groups. For example, the first via portion V1 may include a first via group G1V1 disposed in a first edge region, and a second via group G2V1 spaced apart from the first via group G1V1 by a third interval W7 and disposed in a second edge region.

The first via group G1V1 includes a plurality of first vias spaced apart from each other by a second interval W4 in the second direction. The first via group G1V1 includes a first sub-via V1A and a second sub-via V1B, respectively, and specifically, the first-first via V1-1, the first-second via V1-2, the first-third via V1-3, the first-fourth via V1-4, the first-fifth via V1-5, the first-sixth via V1-6, and the first-seventh via V1-7 spaced apart from each other in the second direction may be included.

Correspondingly, the second via group G2V1 may include a plurality of first vias spaced apart from each other by a second interval W4 in the second direction. The second via group G2V1 includes a first sub-via V1A and a second sub-via V1B, respectively, and specifically, the second-first via V2-1, the second-second via V2-2, the second-third via V2-3, the second-fourth via V2-4, the second-fifth via V2-5, the second-sixth via V2-6, and the second-seventh via V2-7 spaced apart from each other in the second direction may be included.

Meanwhile, the first via group G1V1 may be spaced apart from the second via group G2V1 by a third interval W7. In this case, the third interval W7 may be larger than the first interval W3 and the second interval W4. For example, the third interval W7 may be 60 μm to 120 μm. For example, the third interval W7 may be 70 μm to 120 μm. For example, the third interval W4 may be 80 μm to 100 μm.

In other words, the embodiment includes a region in which vias are not formed corresponding to the third interval W7 of the first region R1. In addition, the plating speed of the first vias included in the first via group G1V1 and the plating speed of the first vias included in the second via group G2V1 are maintained substantially the same by the region where the via is not formed, and accordingly, it is possible to maintain planarization by minimizing the plating deviation. Furthermore, the embodiment may improve the heat dissipation characteristics in the edge region by dividing the first via group G1V1 and the second via group G2V1 as described above, and accordingly, reliability may be improved.

FIG. 9 is a view showing a package substrate according to an embodiment.

Referring to FIG. 9, the package substrate may include the circuit board of FIG. 2.

Specifically, the package substrate may include a first adhesive member 210 disposed on the circuit pattern layer exposed through the opening of the first protective layer 141 of the circuit board. In addition, the package substrate may include a second adhesive member 240 disposed on the circuit pattern layer exposed through the opening of the second protective layer 142 of the circuit board.

The first adhesive member 210 and the second adhesive member 240 may have different shapes. For example, the first adhesive member 210 may have a hexahedral shape. For example, a cross-section of the first adhesive member 210 may include a rectangular shape. For example, the cross-section of the first adhesive member 210 may include a rectangular or square shape. The second adhesive member 240 may have a spherical shape. For example, a cross-section of the second adhesive member 240 may include a circular shape or a semicircular shape. For example, the cross-section of the second adhesive member 240 may include a partially or entirely rounded shape. For example, the cross-sectional shape of the second adhesive member 240 may include a flat surface on one side and a curved surface on the other side opposite to the one side. Meanwhile, the second adhesive member 240 may be a solder ball, but is not limited thereto.

A chip 220 may be mounted on the first adhesive member 210. For example, the chip 220 may include a drive IC chip. For example, the chip 220 may refer to various chips including sockets or devices other than a drive IC chip. For example, the chip 220 may include at least one of a diode chip, a power IC chip, a touch sensor IC chip, an MLCC chip, a BGA chip, and a chip capacitor. For example, the chip 220 may be a power management integrated circuit (PMIC). For example, the chip 220 may be a memory chip such as a volatile memory (e.g. DRAM), a non-volatile memory (e.g. ROM), a flash memory, or the like. For example, the chip 220 may be an application processor (AP) chip such as a central processor (e.g. CPU), a graphics processor (e.g. GPU), a digital signal processor, an encryption processor, a microprocessor, and a microcontroller, or a logic chip such as an analog-to-digital converter or an application-specific IC (ASIC). Here, although it is illustrated that only one chip is mounted on the package substrate in the drawings, the embodiment is not limited thereto. The package substrate may include a plurality of chips, and the plurality of chips may include a first AP chip corresponding to a central processor (CPU) and a second AP chip corresponding to a graphics processor (GPU).

A molding layer 230 may be formed on the circuit board. The molding layer 230 may be disposed to cover the mounted chip 220. For example, the molding layer 230 may be an epoxy mold compound (EMC) formed to protect the mounted chip 220, but is not limited thereto.

A circuit board of the embodiment includes a first via portion. The first via portion includes a plurality of first vias spaced apart from each other in a second direction. In this case, each of the plurality of first vias includes a plurality of sub vias spaced apart from each other in a first direction. In addition, each of the plurality of sub vias has a bar shape in which a width in a first direction is greater than a width in a second direction. In an embodiment, each of the first vias includes a plurality of sub vias extending in the first direction, and accordingly, the embodiment may reduce the number of plating processes compared to a comparative example. For example, the comparative example did not include a plurality of sub-vias as in the embodiment, but an integrated via made of one. However, when the width of the via is not considered at all as in the comparative example, a dimple size increases as the width of the via increases, and accordingly, there is a problem in that the number of plating processes increases.

In contrast, when the width of the via compared to the thickness of the insulating layer exceeds a certain level, the embodiment consists of a plurality of sub vias in order to minimize the dimples of the via, and accordingly, it is possible to reduce the number of plating processes by reducing the dimple size during the plating process.

In addition, the embodiment divides the plurality of first vias into a first via group and a second via group spaced apart in a second direction, a spaced interval between the first via group and the second via group is greater than a spaced interval between the plurality of first vias. Accordingly, the embodiment maintains the plating speed of the first vias included in the first via group and the plating speed of the first vias included in the second via group substantially the same. Accordingly, it is possible to maintain the flatness of the plating by minimizing the plating deviation. Also, the embodiment may improve the heat dissipation characteristics in an edge region by dividing the plurality of first vias into a first via group and a second via group as described above, and accordingly, reliability may be improved.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising:

an insulating layer;

a first pad disposed under a lower surface of the insulating layer;

a second pad disposed on an upper surface of the insulating layer; and a through electrode part passing through the insulating layer and connecting the first pad and the second pad, wherein the insulating layer has a thickness in a range of 40 μm to 70 μm, wherein a width of the second pad in a first horizontal direction exceeds 15 times the thickness of the insulating layer, wherein the through electrode part includes a plurality of first through electrodes spaced apart from each other in a second horizontal direction perpendicular to the first horizontal direction, wherein each of the plurality of first through electrodes includes a first sub through electrode and a second sub through electrode spaced apart from each other in the first horizontal direction, wherein the first sub through electrode and the second sub through electrode of each of the plurality of first through electrodes have a first width in the first horizontal direction greater than a second width in the second horizontal direction, wherein the first width is greater than the thickness of the insulating layer and no greater than 25 times the thickness of the insulating layer, wherein, in each of the plurality of first through electrodes, a first separation distance between the first sub through electrode and the second sub through electrode in the first horizontal direction is smaller than the second width, wherein a second separation distance in the second horizontal direction between the first sub through electrodes of two adjacent first through electrodes among the plurality of first through electrodes is smaller than the second width, and wherein the first separation distance is smaller than the second separation distance.

2. The circuit board of claim 1, wherein lower surfaces of the plurality of first through electrodes are in common connected with an upper surface of the first pad.

3. The circuit board of claim 1, wherein upper surfaces of the plurality of first through electrodes are in common connected with a lower surface of the second pad.

4. The circuit board of claim 1, wherein a width of a lower surface of each of the plurality of first through electrodes is smaller than a width of an upper surface of each of the plurality of first through electrodes.

5. The circuit board of claim 4, wherein each of the plurality of first through electrodes has an inclination in which a width gradually decreases from the upper surface to the lower surface.

6. The circuit board of claim 1, further comprising:

a via electrode part passing through the insulating layer and spaced apart from the through electrode part in the first and second horizontal directions.

7. The circuit board of claim 6, wherein widths of the via electrode part in the first and second horizontal directions are smaller than the first width and the second width.

8. The circuit board of claim 6, wherein the via electrode part is provided closer to an outer surface of the insulating layer than the through electrode part.

9. A semiconductor package comprising:

an insulating layer;

a first pad disposed under a lower surface of the insulating layer;

a second pad disposed on an upper surface of the insulating layer;

a through electrode part passing through the insulating layer and connecting the first pad and the second pad;

an adhesive member disposed on the second pad; and a semiconductor chip disposed on the adhesive member, wherein the insulating layer has a thickness in a range of 40 μm to 70 μm, wherein a width of the second pad in a first horizontal direction exceeds 15 times the thickness of the insulating layer, wherein the through electrode part includes a plurality of first through electrodes spaced apart from each other in a second horizontal direction perpendicular to the first horizontal direction, wherein each of the plurality of first through electrodes includes a first sub through electrode and a second sub through electrode spaced apart from each other in the first horizontal direction, wherein the first sub through electrode and the second sub through electrode of each of the plurality of first through electrodes have a first width in the first horizontal direction greater than a second width in the second horizontal direction, wherein the first width is greater than the thickness of the insulating layer and no greater than 25 times the thickness of the insulating layer, wherein, in each of the plurality of first through electrodes, a first separation distance between the first sub through electrode and the second sub through electrode in the first horizontal direction is smaller than the second width, wherein a second separation distance in the second horizontal direction between the first sub through electrodes of two adjacent first through electrodes among the plurality of first through electrodes is smaller than the second width, and wherein the first separation distance is smaller than the second separation distance.

10. The semiconductor package of claim 9, wherein lower surfaces of the plurality of first through electrodes are in common connected with an upper surface of the first pad; and wherein upper surfaces of the plurality of first through electrodes are commonly connected to lower surfaces of the second pad.

11. The semiconductor package of claim 9, wherein a width of a lower surface of each of the plurality of first through electrodes is smaller than a width of an upper surface of each of the plurality of first through electrodes; and wherein each of the plurality of first through electrodes has an inclination in which a width gradually decreases from the upper surface to the lower surface.

* * * * *